(12) United States Patent
Boillot

(10) Patent No.: US 7,978,091 B2
(45) Date of Patent: Jul. 12, 2011

(54) METHOD AND DEVICE FOR A TOUCHLESS INTERFACE

(75) Inventor: Marc Boillot, Plantation, FL (US)

(73) Assignee: NaviSense, Plantation, FL (US)

( * ) Notice: Subject to any disclaimer, the term of this patent is extended or adjusted under 35 U.S.C. 154(b) by 926 days.

(21) Appl. No.: 11/844,329

(22) Filed: Aug. 23, 2007

(65) Prior Publication Data

US 2008/0048878 A1    Feb. 28, 2008

Related U.S. Application Data

(60) Provisional application No. 60/839,742, filed on Aug. 24, 2006.

(51) Int. Cl.
 *G08B 21/00* (2006.01)
(52) U.S. Cl. ............ 340/686.1; 340/565; 340/567; 340/686.6
(58) Field of Classification Search .......... 715/856, 715/863, 864; 340/686.1, 561, 552, 565, 340/567, 686.6
See application file for complete search history.

(56) References Cited

U.S. PATENT DOCUMENTS

| | | | |
|---|---|---|---|
| 5,274,363 A | 12/1993 | Koved | |
| 6,120,663 A * | 9/2000 | Kato et al. | 204/401 |
| 6,130,663 A * | 10/2000 | Null | 345/158 |
| 6,137,427 A | 10/2000 | Binstead | |
| 6,313,825 B1 | 11/2001 | Gilbert | |
| 6,937,227 B2 | 8/2005 | Qamhiyah | |
| 7,078,911 B2 | 7/2006 | Cehelnik | |
| 7,081,884 B2 | 7/2006 | Kong | |
| 7,092,109 B2 | 8/2006 | Satoh | |
| 7,130,754 B2 | 10/2006 | Satoh | |
| 2003/0132913 A1 | 7/2003 | Issinski | |
| 2004/0095384 A1 * | 5/2004 | Avni et al. | 345/745 |
| 2006/0010400 A1 * | 1/2006 | Dehlin et al. | 715/856 |
| 2006/0092022 A1 | 5/2006 | Cehelnik | |
| 2006/0161871 A1 | 7/2006 | Hotelling | |
| 2006/0164241 A1 | 7/2006 | Makela | |
| 2006/0224429 A1 | 10/2006 | Mathew | |
| 2006/0256090 A1 | 11/2006 | Huppi | |
| 2007/0127039 A1 | 6/2007 | Njolstad | |

* cited by examiner

*Primary Examiner* — Daryl Pope

(57) ABSTRACT

A method (400) and device (100) for touchless control of an headset or earpiece is provided. The device can include a sensing unit (202) for determining (402) a presence of a finger within a proximity of the earpiece, tracking (404) a touchless movement of the finger in air within the proximity, selecting (410) the control in accordance with a movement of the finger, and adjusting (414) the control in accordance with the tracking. A circular movement of the finger can be tracked for scrolling through a list. Menu options in the list can be audibly played during the scrolling.

20 Claims, 9 Drawing Sheets

900

950

METHOD AND DEVICE FOR A TOUCHLESS INTERFACE

CROSS-REFERENCE TO RELATED APPLICATIONS

This application claims the priority benefit of U.S. Provisional Patent Application No. 60/839,742 entitled "Method and Device for a Touchless Interface" filed Aug. 24, 2006, the entire contents of which are hereby incorporated by reference. This application also incorporates by reference the following Utility Application: U.S. patent application Ser. No. 11/683,415, entitled "Virtual Interface Method and System Thereof", filed on Mar. 7, 2007.

FIELD

The present embodiments of the invention generally relate to the field of electronic accessory devices, more particularly to mobile device earpieces and headsets.

BACKGROUND

Mobile communication devices such as cell phones generally include a keypad and display for allowing a user to interact with mobile device applications. A user can navigate through menus presented on the display of the mobile device by depressing one or more keys on a keypad. Some keypads include a navigation pad which allows a user to navigate menus on the keypad in an ergonomic manner. The keypad and the navigation pads are generally touch-based which require physical user interaction. A user can physically touch the keypad or navigation pad to navigate through a menu system on the display.

Mobile devices, such as cell phones, are generally limited in size, and thus have small keypads. As one example, certain mobile devices can include miniature keyboards which allow users to perform text messaging functions. The size of the keypad can limit the ease at which users can type on the miniature keypad, or navigate menus on the display via a keypad, to interact with the cell phone. Such keyboards and keypads have keys with a touching area that is generally smaller than the size of a user's finger which can provide more keys to provide more user menu options.

Moreover, certain mobile devices can be used in hands-free mode, such as a headset or earpiece, further reducing the touch-based keypad area. For example, certain headsets, such as Blue Tooth enabled earpieces, can fit comfortably in a user's ear and provide short range communication with a cell phone on the user's person. The user generally interacts directly with the keypad or keyboard of the cell phone, and not the headset or earpiece. However, in order to navigate menus, a user handles the cell phone and navigates through menus presented on the display of the cell phone using the keypad of the cell phone. The user does not generally interact with the headset or earpiece due to the small size of the earpiece and limited area for a keypad. Moreover, such user interaction with the cell phone is touch-based and generally requires a user to handle a mobile device.

BRIEF DESCRIPTION OF THE DRAWINGS

The features of the embodiments of the invention, which are believed to be novel, are set forth with particularity in the appended claims. Embodiments of the invention, together with further objects and advantages thereof, may best be understood by reference to the following description, taken in conjunction with the accompanying drawings, in the several figures of which like reference numerals identify like elements, and in which:

DETAILED DESCRIPTION

Figure 1:
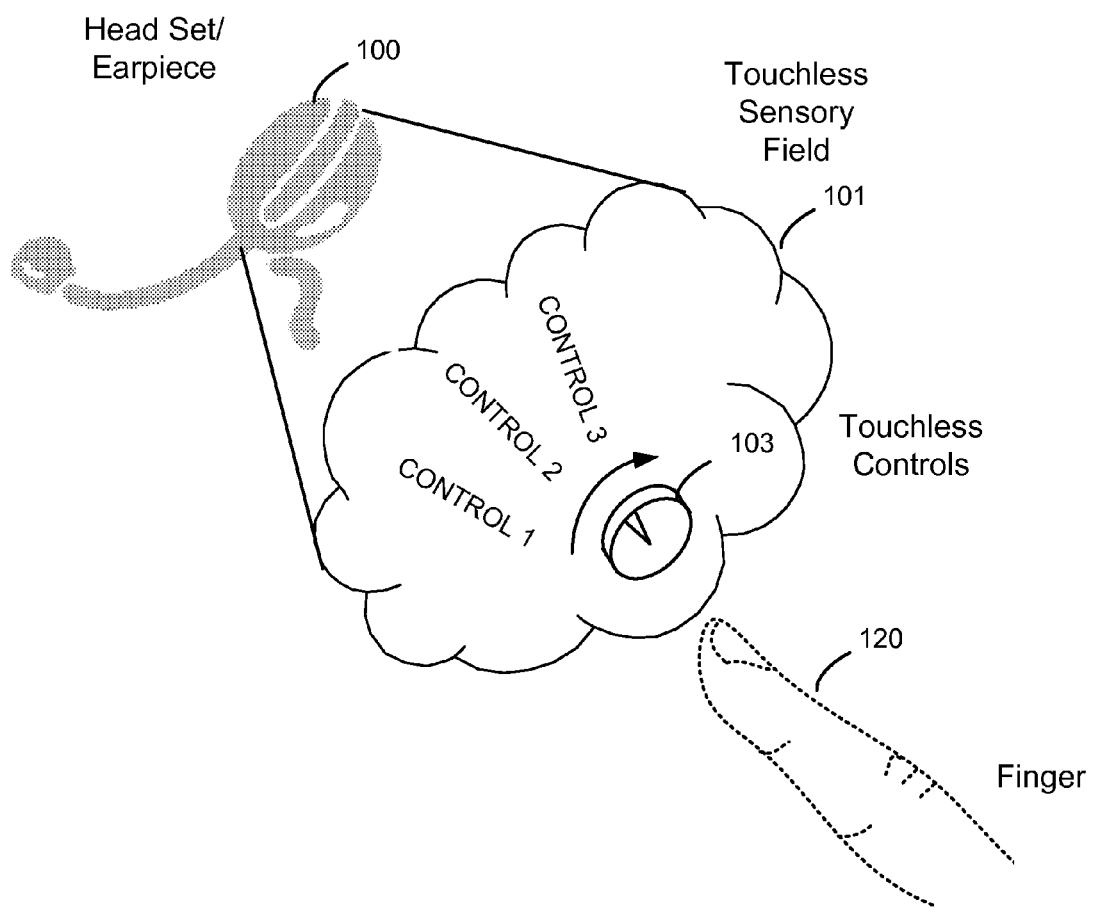
FIG. 1 is headset device providing touchless user interface control in accordance with an embodiment of the inventive arrangements.

While the specification concludes with claims defining the features of the invention that are regarded as novel, it is believed that the invention will be better understood from a consideration of the following description in conjunction with the drawing figures, in which like reference numerals are carried forward.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

The term "space" can be defined as exhibiting a three-dimensional aspect. The term "sensory space" can be defined as a three-dimensional volume. The term "field" can be defined as exhibiting a two-dimensional or three-dimensional aspect. The term "earpiece" can be defined as a device having an earpiece attachment that fits on a person's head or an earpiece device that fits within or around a persons ear. The term "proximity" can be defined as a general location or local area. The term "touchless" can be defined as not requiring physical touch.

Broadly stated, embodiments of the invention are directed to a method and system for providing a touchless interface to a mobile device. One embodiment includes a method of operating a earpiece or a headset. The method can include determining a presence of at least one finger within a proximity of the device, tracking a movement of the at least one finger in air within the proximity, and adjusting at least one control in accordance with the tracking a movement. A control can be audibly presented in response to a presence of the at least one finger. The method can further include detecting a location of the at least one finger, and adjusting a control associated with the location.

The method can include identifying an approximately circular motion of the at least one finger, and adjusting a control in accordance with the approximately circular motion. In one arrangement, a clockwise motion relative to the at least one finger can increase the control, and a counter-clockwise motion relative to the at least one finger can decrease the control. The tracking can include scrolling through a list in accordance with the approximately circular motion, audibly presenting at least one entry in the list during the approximately circular motion, identifying a pause of the at least one finger during the approximately circular motion, and associating the at least one entry identified during the pause with a control. The entry identified by the tracking can be audibly presented based on at least one of an absolute location of the at least one finger, a relative location of the at least one finger, or a time period at a location. In one aspect, a forward projecting motion or up and down motion of the at least one finger can be identified for selecting the at least one entry.

In one arrangement, the entry can identify a control for a song selection, a track selection, a volume selection, a balance selection, an equalization selection, a name selection, a call selection, an address selection, an email selection, a voicemail selection, or an audio message. In another arrangement, the control can be a handle to an email account, such that a user moves a finger in air in an approximately circular motion and scrolls through the email, wherein a field, or a portion of, an email is audibly played during the approximately circular motion, and a content of the email is audibly played upon a selection of the email. A field can include a header of an email subject field, a "from" user field, a "to" user field, a date of the email field, or an attachment option field.

In one arrangement, an increase in the approximately circular movement of the finger can speed up the scrolling, and a decrease in the approximately circular movement of the finger can slow down the scrolling. In another arrangement, an increase of an approximately circular and clockwise movement of the finger can fast-forward a playing of an audio message, and, an increase of an approximately circular and counter-clockwise movement of the finger can rewind the playing of the audio message. The audio message may be a voice mail, a voice recording, an audio advertisement, or a piece of music.

Referring to FIG. 1 a sensory device 100 providing touchless user interface control is shown. The sensory device 100 can be an earpiece, an ear bud, a Bluetooth earpiece, a Bluetooth headset, a behind the ear device, an in-the-canal earpiece, a hearing aid, a ZigBee earpiece, a ZigBee headset, an in-the-ear cell phone but is not limited to the and may be any other suitable communication device. In one arrangement, the sensors can be ultrasonic sensors or light emitting elements integrated with a headset or earpiece. The sensory device 100 can generate a touchless sensory field 101 within a proximity of the headset or earpiece. The touchless sensory field 101 can project in three-dimensions for detecting a presence of an object. The device 100 can detect the presence of the object within the touchless sensory field 101. Moreover, the sensory device 100 can track a movement of the object and a location of the object within the touchless sensory field 101.

As an example, a user of the sensory device 100 can position his or her finger 120 within the touchless sensory field 101 to acquire one or more touchless controls 103 of the sensory device 100. Moreover, the user can adjust the one or more touchless controls 103 by moving the finger 120 in the touchless sensory field 101. For instance, a user can adjust a volume of the headset via finger motions to increase or decrease the volume. Other touchless controls, such as audio controls, email controls, music controls, or internet controls can be controlled via touchless sensing. It should also be noted that the touchless sensory field 101 can be projected on the surface of the headset or earpiece 100. For example, the user can move the finger along the surface of he headset via finger movements to adjust one or more media controls.

In one arrangement, the sensory device 100 can identify an approximately circular motion of the finger 120, and adjust the control 103 in accordance with the approximately circular motion. As an example, a clockwise motion relative to the finger can increase the earpiece control, and a counter-clockwise motion relative to the finger can decrease the earpiece control. The sensory device 100 can also include at least one touchpad for detecting a touching of the sensory device 100 for selecting a control, and adjusting the control that is selected.

It should be noted that the opration for touchless control of a device is not limited to earpieces and headsets. That is, the sensing components and control logic of the sensory device 100 generating the touchless sensory field 101 and enabling touchless control 103 can be ported to other mobile devices such as a cell phone, a personal digital assistant, a portable music player, a camera, or any other suitable communication device, mobile or non-mobile. In practice, the methods and device for touchless control herein disclosed applies equally to mobile devices such as cell phones having limited keypad area.

Figure 2:
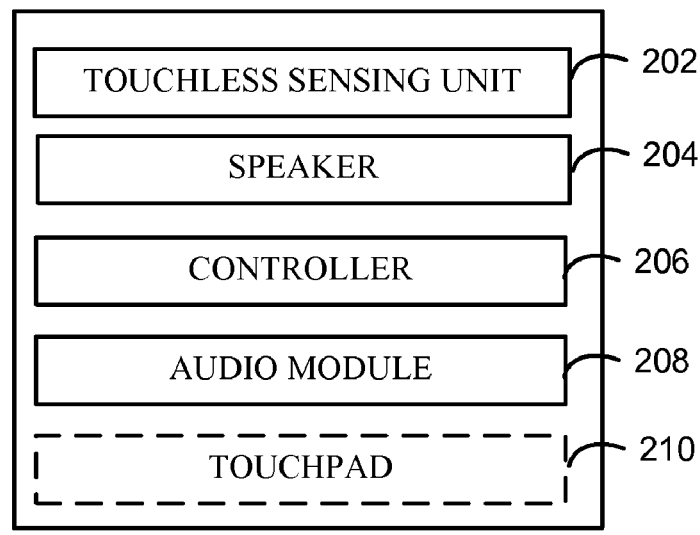
FIG. 2 is a block diagram of the headset device of FIG. 1 in accordance with an embodiment of the inventive arrangements.

Referring to FIG. 2, a block diagram of the sensory device 100 is shown. The sensory device 100 is not limited to the components shown, and can include more than the number of components can be provided. The sensory device 100 can include a touchless sensing unit 202 for detecting a presence, a location, and a movement of an object, a speaker 204 for playing audio in accordance with the detecting the object, a controller 206 for interfacing with one or more controls of the sensory device 100 based on a location or movement of the object, and an audio module 208 for playing audio out of the speaker 204. The touchless sensing unit 202 can generate the touchless sensory field 101 (See FIG. 1) and identify a location and movement of the finger 120 (See FIG. 1) within the touchless sensory field 101. The sensory device 100 can also include a transceiver (not shown) for communicating touchless controls to another device, for example, via Bluetooth, and a memory (not shown) for storing computer program instructions.

Referring back to FIG. 1, a location or a movement of the finger 120 can be associated with a control as the user moves the finger 120 in the touchless sensory field 101. For example, each location of the finger (e.g. absolute) or each movement (e.g. relative) of the finger can be associated with a control 103. As the finger 120 moves to a new location, or performs a movement associated with a control 103, the audio module 206 can play audio through the speaker 204 or earpiece for informing the user of the control available. For example, as the user moves a finger in a circular manner for adjusting a control 103, the audio module can play the name of the control to the user. The control may describe the control, a value of the control, an option for the control, or any other associated description for informing the user of the control granted based on the location or movement of the finger 120.

Referring again to FIG. 2, the controller 206 can associate a finger action or movement with the control. The touchless sensing unit 202 can also include a timer (not shown) for determining a time window for which an activation cue, such as the positioning of a finger in the touchless sensory field 101, for detecting a pause. The touchless sensing unit 202 can also include a clock (not shown) for determining a time a finger is at a location, or a duration of a finger movement. For example, when a user intentionally places a finger at a center location of the touchless sensory field 101, the sensing unit 202 identifies a position of the finger and employs the timer to acquire control. The timer can provide functions for estimating a time difference such as pulse echo range detection. In another arrangement, but not required, the touchless sensory device 100 can include a touchpad 210. The user can touch the touchpad to turn on or off the touchless sensing device 202. The touchpad 210 can be used to preserve battery life of the sensory device 100 by only turning on or off the touchless sensing unit 202 when a user wants to initiate touchless control.

Figure 3:
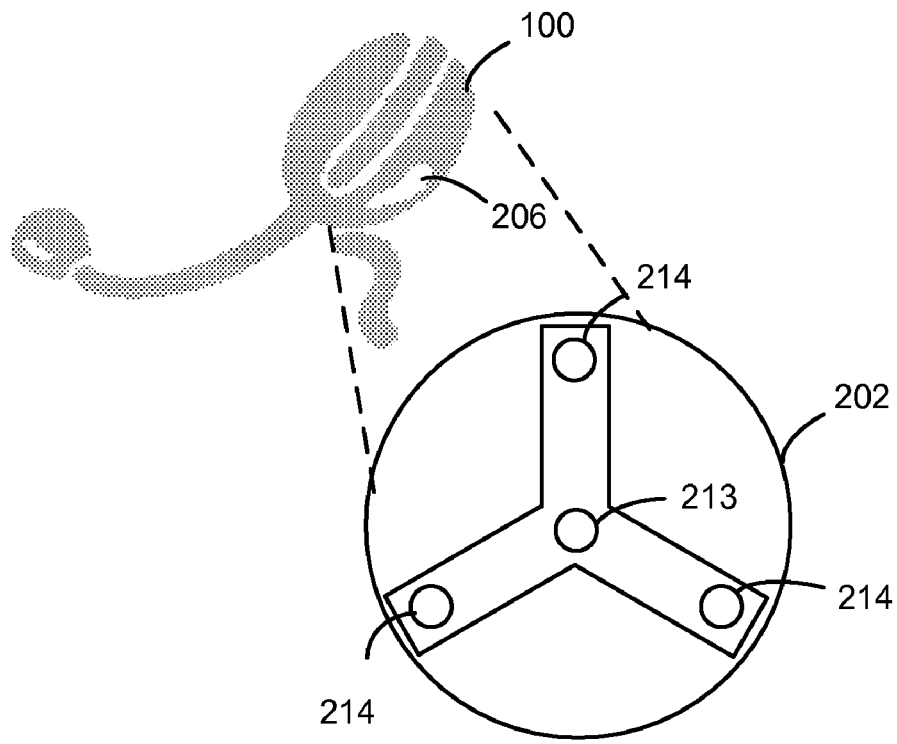
FIG. 3 is an exemplary diagram of a touchless sensing unit for the headset device FIG. 2 in accordance with an embodiment of the inventive arrangements.

Referring to FIG. 3, an exemplary schematic of the touchless sensing unit 202 is shown in the context of the sensory device 100. The touchless sensing unit 202 can include one or more sensors 213 and 214. The sensors can be light emitting diodes and light receiving elements, such as infrared elements or miniature camera elements. The sensors can also be laser elements or MEMS optical elements. The sensors can also be acoustic sensors such as ultrasonic sensors including transmit and receive sensors for employing principles of range detection to determine a location of an object. The sensors can also employ surface acoustic wave elements for generating surface waves across the headset or earpiece 100. In one arrangement, the system can also include at least two piezoelectric transducers to turn vibration energy associated with a touch to electric signals. Understandably, the touchless sensing device 202 is not limited to the sensors, or arrangement and configuration shown.

In practice, a user can raise a finger 120 in the touchless sensory field 101 (See FIG. 1), which can include a surface of the device 100, to acquire a control. In one embodiment, but not herein limited, the touchless sensing unit 202 can emit high energy acoustic pulses or light signals for detecting a presence of the finger in the sensory space. That is, a position of the finger can be determined by listening for echo returns, triangulating a location based on one or more received echoes, and calculating a position of the finger. The touchless sensory field 101 can correspond to a region within which a high energy reflection can be detected, or within which an (x,y) or (x,y,z) surface coordinate can be obtained. In one aspect, the touchless sensory field 101 can be a function of the emitted signal strength and the range. As an example, the touchless sensing unit 202 can project a touchless sensory field 101 up to 6 inches, corresponding to the maximum extent of the finger movement when the finger is positioned near the sensory device 100.

As one example, sensor 213 can be an ultrasonic transmitter, and sensors 214 can be receivers, although any other configuration or arrangement of sensors is possible. The sensors 214 may also be small Micro Electro Mechanical System (MEMS) microphones having reception capabilities for ultrasonic signals. As an example, the ultrasonic sensors may be between 40 to 120 KHz, but are not limited to this range. In this arrangement, the transmitter 213 can emit a pulse signal that reflects off the finger, which is detected by the receiver 214 in the sensing unit. The receiver elements 214 are coupled with a detector (not shown) in the touchless sensing unit 202 that detects a signal reflected off the finger as part of the motion detection logic in the touchless sensing unit 202. The detector can include additional processing logic such as thresholds, comparators, logic gates, and clocks for detecting an object's position and motion in accordance with pulse echo range detection, or any other suitable tracking technology. In one arrangement, the touchless sensing unit 202 can calculate a position of the object, such as the finger 120, based on the reflection by solving a set of geometric equations.

The touchless sensing unit 202 can convey finger coordinates to an application, a mobile device, or a system, that can interpret the coordinates and perform a menu task, a navigational task, or a specific control action. Notably, the touchless sensing unit 202 can detect two-dimensional movement in a vertical and horizontal field, as well as a third dimension. That is, the touchless sensing unit 202 can employ three dimensional sensing for operating a control of the headset device. In one particular arrangement, a symmetrical arrangement of the sensors 213 and 214 allows for a one to one mapping of finger position to echo return based on pulse echo range measurements. Accordingly, the touchless sensing unit 202 can detect relative movement such as forward projections and retractions and convert these finger actions to menu commands. Moreover, finger movements can be associated with menu actions such as single click, double click, hold, scroll, slide, and release Finger motion in a vertical and horizontal axes can correspond to moving a cursor object in an x and y direction on the display. A finger depress action, forward action, or retracting can activate a menu command such as a single click.

In one aspect, the relative displacement of cursor movement can be a function of finger location. For example, when a finger is closer to the sensory device 100, more precise menu control is offered. That is, the menu control responds with more sensitivity when the finger is closer. For example, a circular motion of the finger when close to the headset device results in slower scrolling through menus. This can allow for precise movement. When the finger is farther from the sensory device 100 the menu control is coarse. For example, a circular motion of the finger when farther from the headset device results in faster scrolling through menus. Moreover, a user can migrate from a coarse location to a fine location by starting from a far location and moving to a closer location relative to the sensory device 100.

Figure 4:
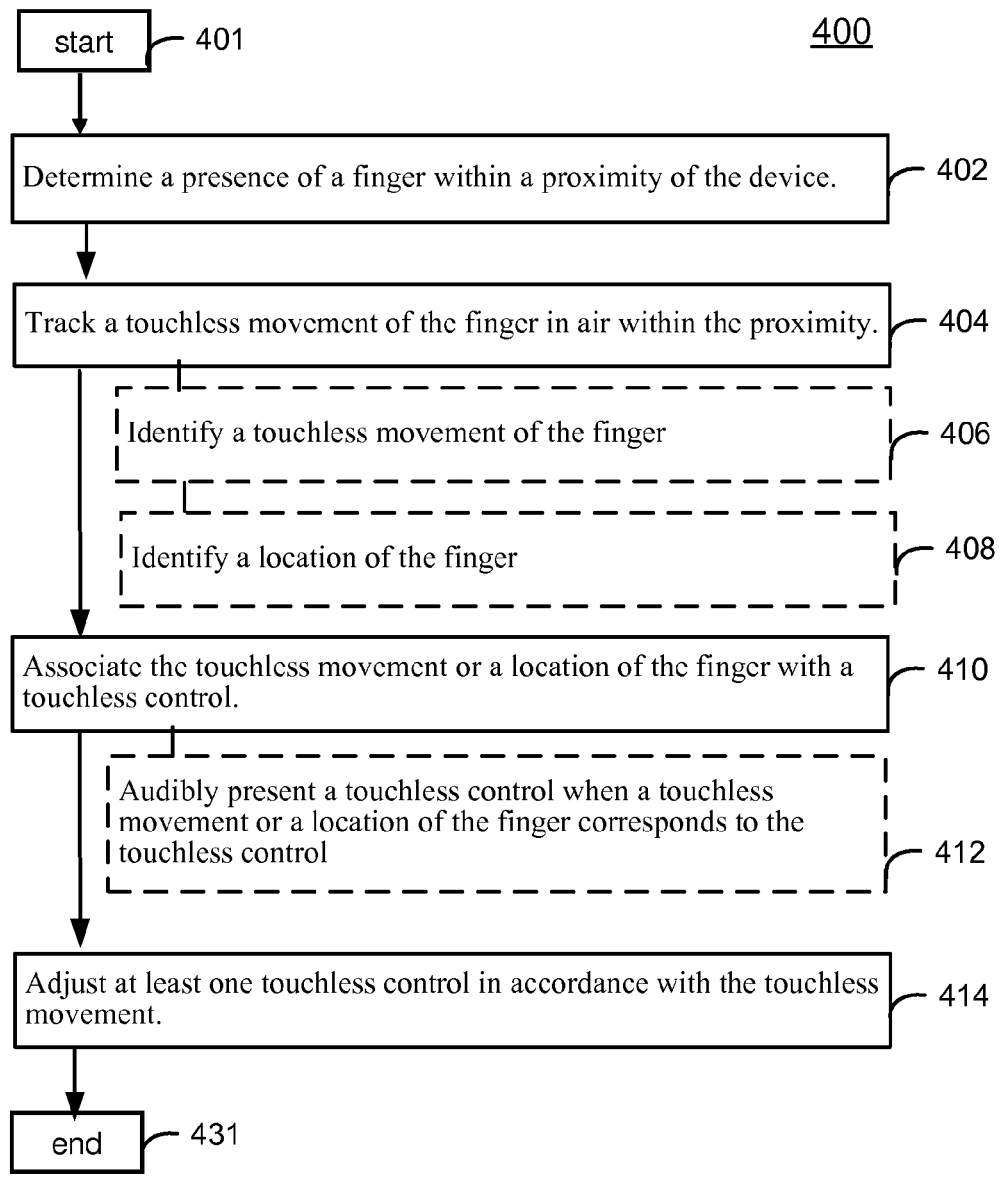
FIG. 4 is method for operating the headset device of FIG. 1 via touchless sensing in accordance with an embodiment of the inventive arrangements.

Referring to FIG. 4, a method 400 for operating a headset device using touchless sensing is shown. The method 400 can be practiced with more or less than the number of steps shown. To describe the method 400, reference will be made to FIGS. 1, 2, and 5 although it is understood that the method 400 can be implemented in any other suitable device or system using other suitable components. Moreover, the method 400 is not limited to the order in which the steps are listed in the method 400 In addition, the method 400 can contain a greater or a fewer number of steps than those shown in FIG. 4.

At step 401, the method 400 can start. At step 402, a presence of at least one finger within a proximity of the device can be determined. For example, referring to FIG. 1, the sensory device 100 may be on a user's head having an earpiece attachment coupled to the user's ear. Alternatively, the sensory device 100 may be an earpiece device that fits within or around the user's ear. The user can raise a finger 120 within the touchless sensory field 101 or on the surface of the device 100 to acquire a touchless control, such as a volume of the device 100. Referring to FIG. 2, as one example, the touchless sensing unit 202 can determine a presence of a finger within the touchless sensory field 101 (e.g. proximity) based on a plurality of echo returns. A proximity can correspond to the projection volume of the touchless sensory field 101 (See FIG. 1). For example, the proximity may be within 6-8 inches of the headset device. The sensing device 100 can project the touchless sensory field 101 spherically or elliptically from the sensory device 100 with a radius of 6-8 inches. This allows a user to position the finger 120 anywhere within a three-dimensional volume of the touchless sensory field 101. Accordingly, the touchless sensory field 101 can correspond to a region of 6-8 inches or more in radius. Notably, the proximity can be greater or less than 6-8 inches, which is presented for practical purposes.

At step 404, a touchless movement of the at least one finger in air can be tracked within the proximity. For example, referring to FIG. 1, a user, upon positioning a finger within the touchless sensory field 101 can acquire a touchless control 103. The touchless control 103 may be a function of the location of the finger or a movement of the finger. A touchless movement can also include a location of the finger or a pause of the finger at a location. Accordingly, at step 406, a touchless movement of the finger can be identified. At step 408, a location of the finger can be identified.

In one arrangement, the sensory device 100 can track finger movement in absolute position. That is, a location of the finger with respect to the orientation of the sensory device 100 is used to identify a setting of a touchless control 103. Referring to FIG. 1, a setting may be a dial selection, or a tuning, of the touchless control 103. A touchless turn of the control 103 can be associated with a first control, a second control, or a third control. The controls may also be values or settings, such as a volume level. As an example, the position of the finger can be identified at a location with respect to the sensory device 100. For instance, a Cartesian coordinate system can be generated with a center of the sensory device 100 as the origin. Other reference locations of the sensing device 101 can serve as the origin for the Cartesian coordinate system. A location of the finger can be determined on the Cartesian coordinate system and associated with a dial of the touchless control 103. For example, when the finger is at a location corresponding to Control 1, access to Control 1 can be provided. Similarly, if the finger moves slightly circular to the right, access to Control 2 can be provided. Accordingly, controls can be mapped to finger locations with respect to the Cartesian coordinate system. In this case, the location of the finger 120 can be considered absolute with respect to the headset device.

In another arrangement, the sensory device 100 can track finger movement using relative positioning. That is, a movement of the finger with respect to the finger itself can be used to identify a control. For example, a circular motion can be associated with an increase in control. As another example, an up and down motion can be associated with entering a selection. Notably, a relative movement does not require absolute positioning. For example, a circular movement of the finger 120 can be used to signify an increase in a control. For instance, a user can move the finger 120 in a clockwise motion in the air within the touchless sensing field 101 to increase a volume control. Each incremental distance of the finger may or may not correspond to an equal incremental distance for adjusting the control 103. A counter clockwise circular movement can be associated with a decrease in control. For instance, the user can move the finger 120 in a counter clockwise motion in the air within the touchless sensing field 101 to decrease a volume control. Notably, the sensing unit 100 can track relative movement within the sensory field for acquiring control based on a relative movement. That is, the circular movement does not need to be in an absolute location with respect to the sensing device 100.

At step 410, the touchless movement of location of the finger can be associated with a touchless control. For example, referring to FIG. 5, a depiction 500 for using the headset device of FIG. 1 is shown. The depiction 500 illustrates touchless finger movements for operating one or more controls of the sensory device 100. For example, the touchless control may correspond to a telephone control. Menu options such as call lists, contacts, messages, settings, memos, call timers, date book, calendar, names and the like can be included with the telephone control 140. As another example, the touchless control 140 may correspond to one or more audio controls such as a song selection, a track selection, a volume, a balance, or an equalization though is not limited to these. The touchless control 140 allows a user to adjust control options for the sensory device 100 without physically touching the sensory device 100.

In one arrangement, the user can move the finger in an approximately circular motion to adjust the control 140. For example, as the user moves the finger in the air in a clockwise motion within the proximity of the sensory device 100, a dial 176 of the control 140 can select various controls in accordance with a movement of the finger. For example, a first location or movement of the finger can correspond to Song selection, a second location or continued clockwise circular movement can correspond to a volume control, a third location or continued clockwise circular movement can correspond to a balance control and so on. The controls can be modulo based such that as the finger moves in a circular pattern, the dial returns to the first control when the control list is completed. In another arrangement, the user can issue up and down finger movements to skip ahead to a next control, or enter a menu selection of the touchless control.

Referring back to method 400 of FIG. 4, at step 412, a touchless control can be audibly presented when a touchless movement or the location of the at least one finger corresponds to a touchless control. For example, referring to FIG. 5, upon associating a finger location or movement with a control, an audio clip can be played to the user to inform the user of the control available for selection. In one aspect, each location of the finger can correspond to a dial 176 setting; volume, balance, equalize, etc. As the user moves the finger, the audio module 208 (See FIG. 2) can play the control associated with the finger location for informing the user of the available control. For example, and audio description can be played out the speaker 204 for informing the user of the control. In another arrangement, a relative movement of the finger in the circular pattern can correspond to a dial setting 176. For example, the touchless sensing unit 202 (See FIG. 2), can determine a displacement, or arc, of the finger along the circular pattern for association with a control. Each movement of the finger along the circular pattern corresponding to an arc length can be associated with a dial 176 setting (See FIG. 5). Accordingly, as the user moves in a circular pattern, an audible description if the device setting or control can be played to the user of the headset.

Figure 5:
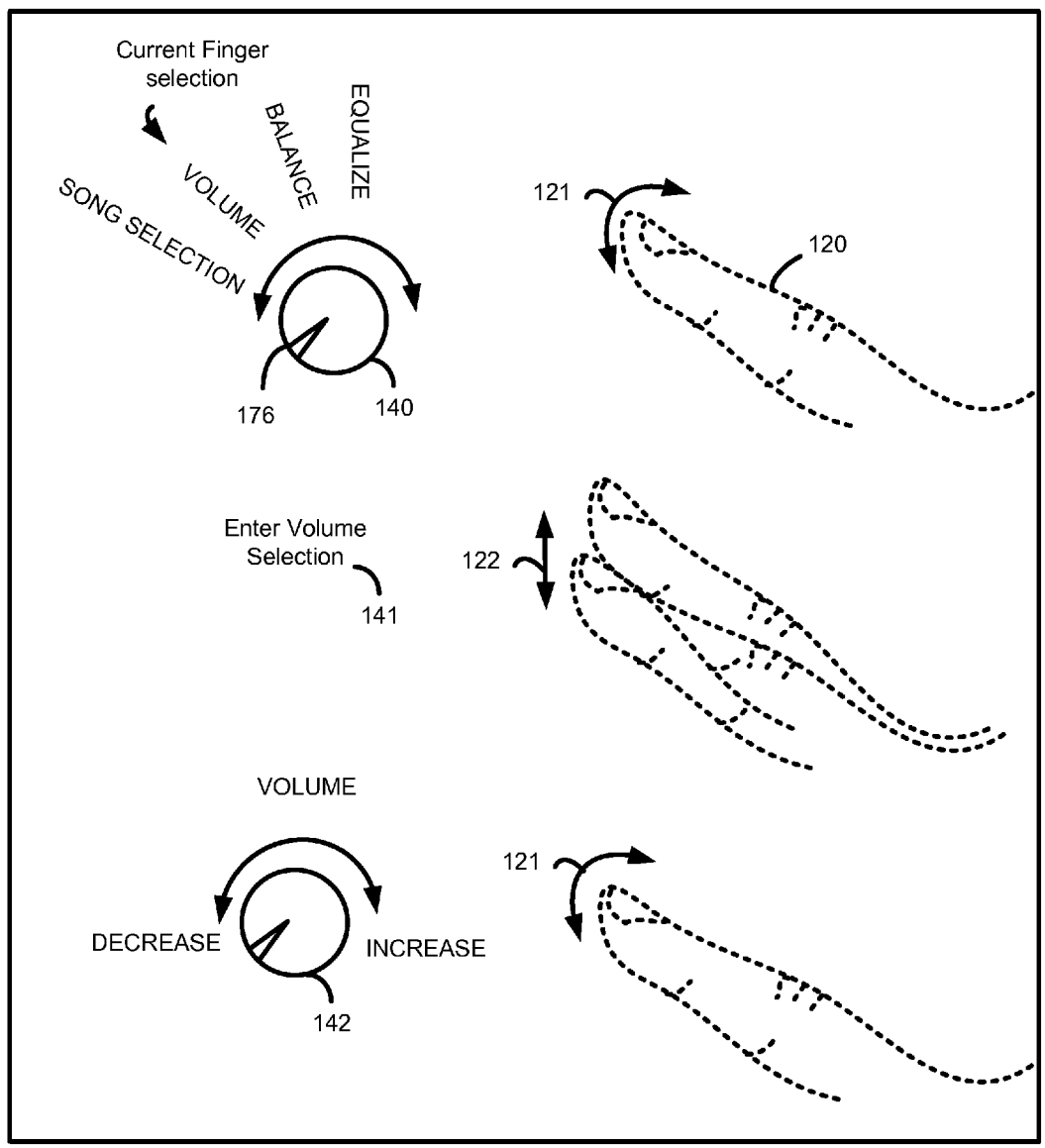
FIG. 5-8 are depictions for using the headset device of FIG. 1 in accordance with an embodiment of the inventive arrangements.

Referring to FIG. 5 the user can scroll through the available controls (e.g. menu selections) via the touchless control 140. As an example, the user may stop the finger at a location corresponding to a volume control. A volume description can be audibly played to the user. The user can select the volume control by moving the finger in an up and down motion 122 for entering the volume selection. Briefly referring to FIG. 2, the touchless sensing unit 202 associates the up and down movement with a selection of the current dial setting. In response, the sensory device 100 will replace the touchless control 140 with a touchless volume control 142. The sensory device 100 can also audibly confirm a volume control selection. That is, the user has selected a dial setting 176 of the touchless control 140, and acquired the touchless volume control 142. This allows the user to interact with the volume control 142 using touchless finger movement in the same manner as the control 140.

Referring back to method 400 of FIG. 4, at step 414, at least one device control can be adjusted in accordance with the touchless movement. For example, upon associating a touchless movement with a location or movement of the finger, the user can adjust a setting. In the example of FIG. 5, upon selecting the volume control 142, the user can adjust a volume level. For example, the user can move the finger in an approximately clockwise and circular movement 121 to increase the volume, or in an approximately counter clockwise and circular movement 121 to decrease the volume. At step 431, the method 400 can end.

Figure 6:
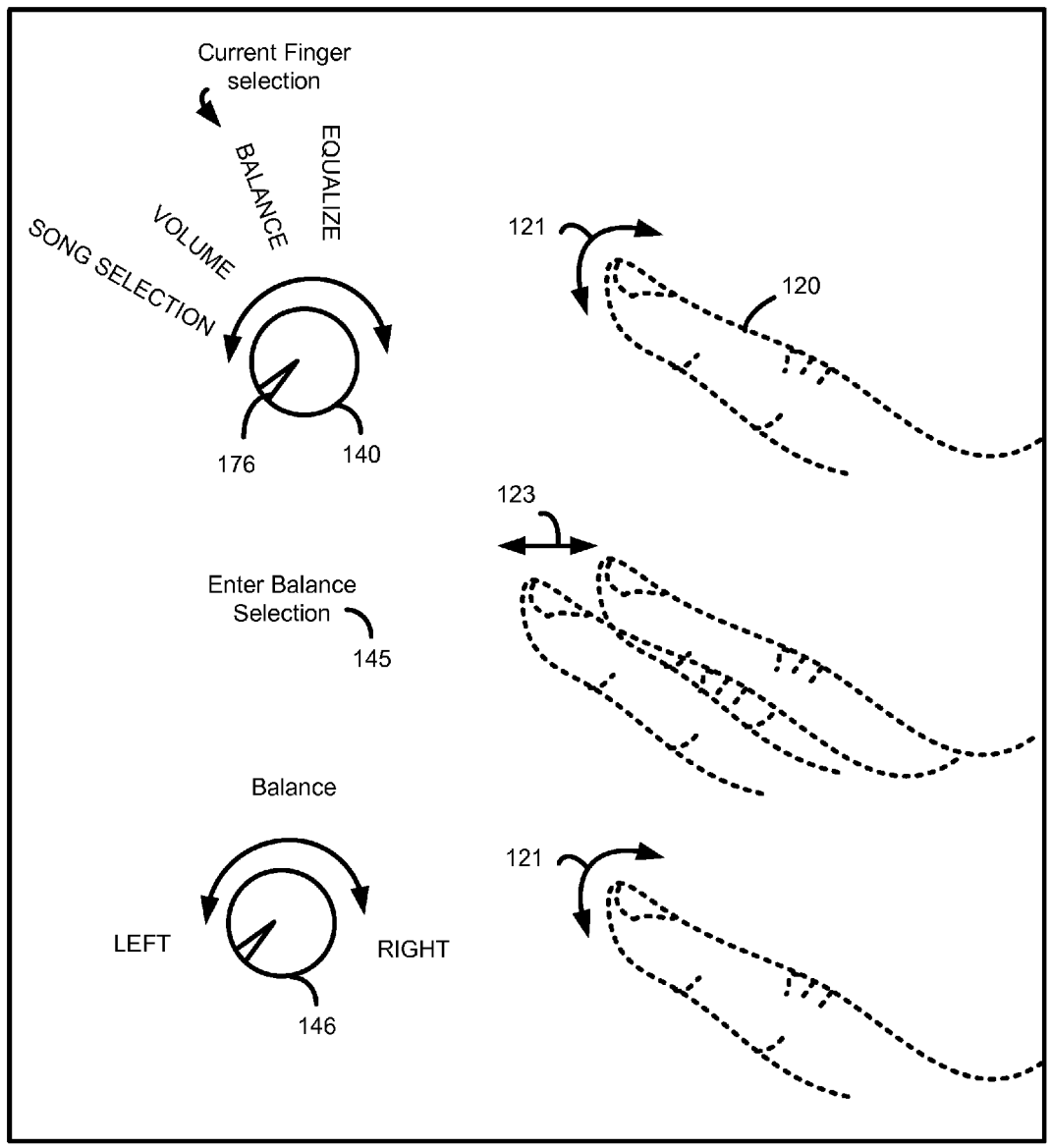

FIG. 6 presents another illustration for using the headset device of FIG. 1 is shown. In particular, the depiction 600 shows another means for entering a selection. For example, the user may enter a selection by issuing a forward and retracting motion of the finger 123. The user can also adjust the dial 176 by moving the finger in an approximately circular motion 121, in the touchless sensing field 101 or along the surface of the device 100. Notably, the finger movement is within the proximity of the sensory device 100 in the touchless sensory field 101 of FIG. 1. The sensory device 100 can identify an approximately circular motion of the at least one finger; and adjust a touchless control in accordance with the approximately circular motion. For example, the user may scroll to the balance control. The headset can audibly play a balance control description. The user can enter the balance selection 145, by projecting the finger in a forward and retracting motion 123. The headset can audibly confirm a balance control selection. Alternatively, the user can issue an up and down motion 122 as shown previously in FIG. 5. The headset can audibly confirm the balance control selection. Upon entering the balance selection 145, the control 140 is replaced with the balance control 146. That is, the user can move the finger in the same touchless sensory field to control the balance control 146. The user can interact with the balance control 146 in a similar manner using touchless finger motion as the control 140. For example, a clockwise motion 121 if the finger relative to the at least one finger increases the touchless control, and a counter-clockwise motion 121 of the finger relative to the at least one finger decreases the touchless control. In this example, the user can adjust a balance of the audio to the left or the right earpiece. Other controls are also herein contemplated, such as increasing a bass, midrange, or treble of an audio. As another example, a menu of songs can be audible presented to the user. The user can select songs via touchless control.

Notably, the user can scroll through a list of controls in accordance with an approximately circular motion of the finger. At least one entry in the list can be audibly played during the approximately circular motion. A movement of the at least one finger can be identified during the approximately circular motion. The at least one entry identified during the movement can be associated with a touchless control. The movement can be a pause, an up and down motion, or a forward projecting motion. For example, referring to FIG. 6, the user can optionally leave the finger at a location for a predetermined amount of time to enter a selection. For instance, to enter the balance selection 145, the user can hold the finger still for one or more seconds. The sensory device 100 can associate the pause with a menu selection entry. For example, the pause can be associated with a balance selection. Accordingly, the balance control 146 can be presented to the user. That is, the user can perform touchless sensing via finger movement to adjust the balance control 146.

Figure 7:
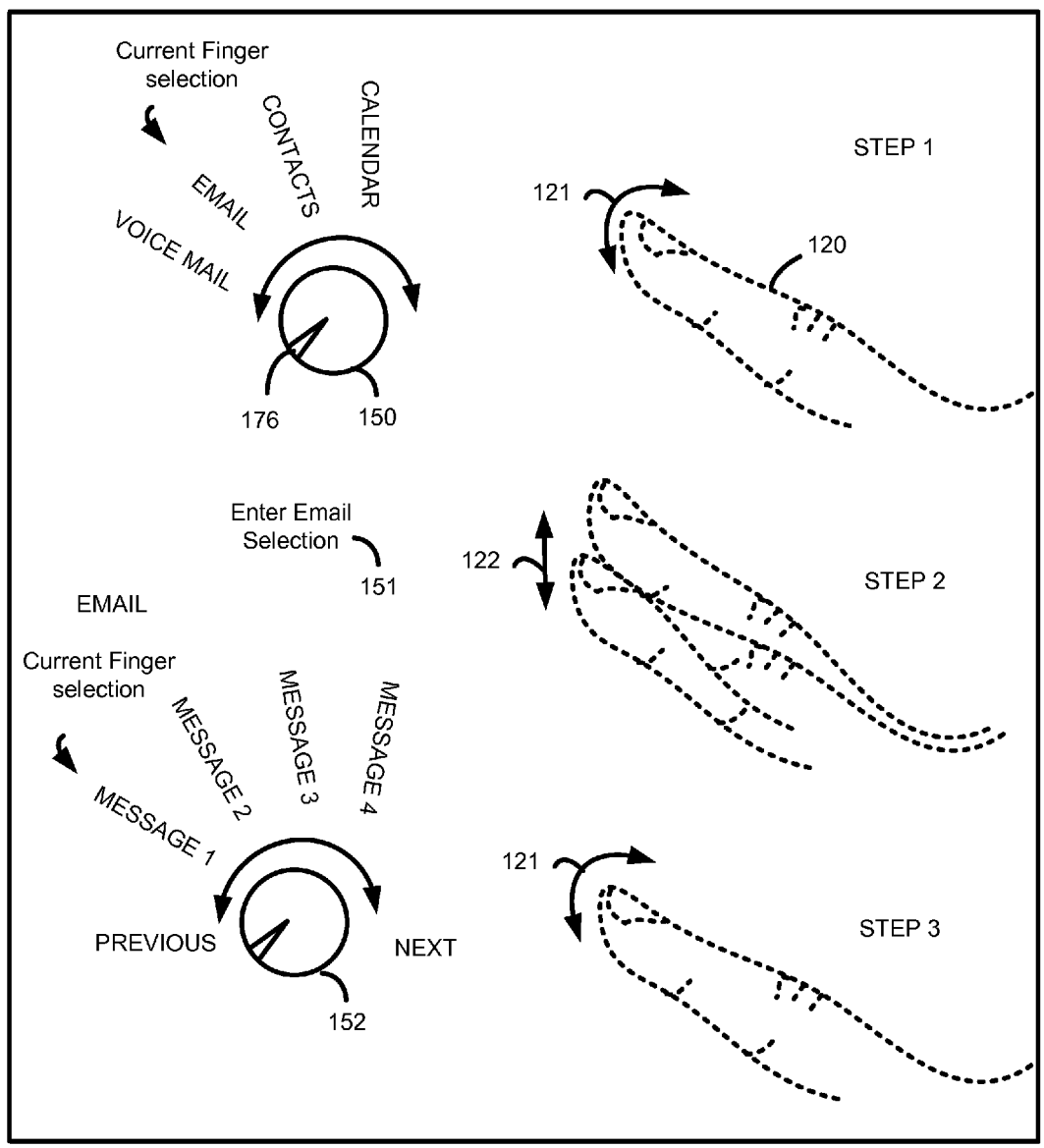
Figure 8:
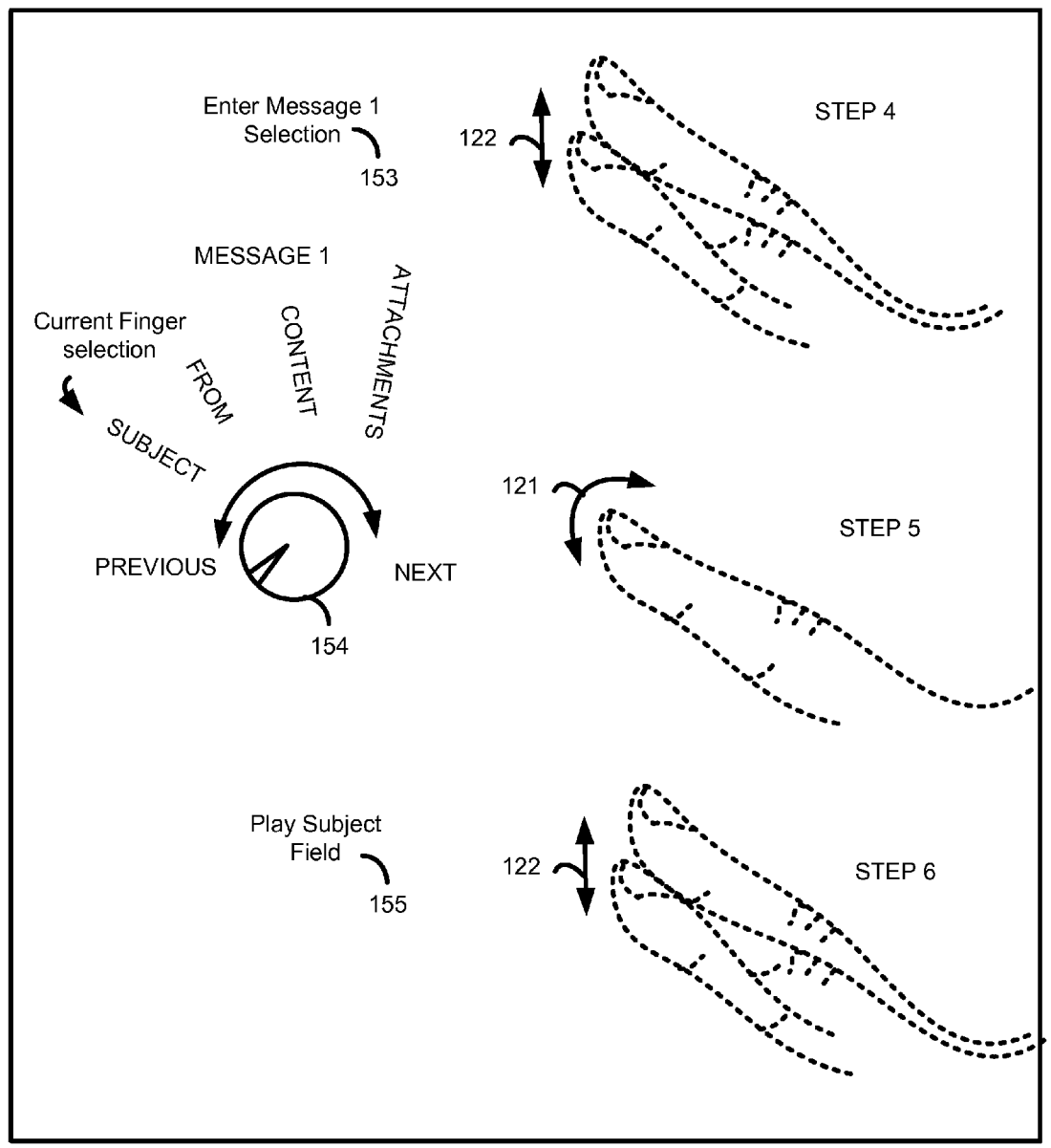

Referring to FIGS. 7 and 8, an exemplary email application 700 using the method 400 for operating a headset device is shown. In one arrangement, the email application may include voice mail services for playing back or recording messages. Briefly, A touchless email control is provided as a handle to an email account, such that a user moves a finger in air in an approximately circular motion and scrolls through email, a field of an email can be audibly played during the approximately circular motion, and a content of the email can be audibly played upon a selection of the email.

For example, at step 1, a user can be presented an email control 150. The email control can include voice mail, email, contacts, calendar, or any other suitable email menu option. The user can scroll through the menu options to dial 176 a menu option. Each option can be audibly presented to the user as the user scrolls through the email control 150. As an example, the user may scroll to the email selection. At step 2, the user can issue a touchless up and down finger movement to enter the email selection. Notably, the sensory device 100 associates the email selection with the up and down movement. Accordingly, at step 3, the email control 152 is presented. The email control 152 may include emails for the user such as message 1, message 2, message 3, and so on. The user can move the finger in an approximately circular motion to scroll to a message.

Referring to FIG. 8, the email application 700 is continued. At step 4, the user may select a message by issuing an up and down touchless finger movement 122. The headset unit 100 can then present a field control 154 for the message. For example, each message may have a corresponding subject field, a from field, a to field, a message content, or any other suitable email option. The user can similarly select a message option. For example, at step 5, the user can scroll to the field. The user may want to hear who the email is from, or what is the subject, or what is the date, and so on. At step 6, the user may elect to play the content of the message by issuing an up and down movement. Accordingly, the headset can play the message.

Figure 9:
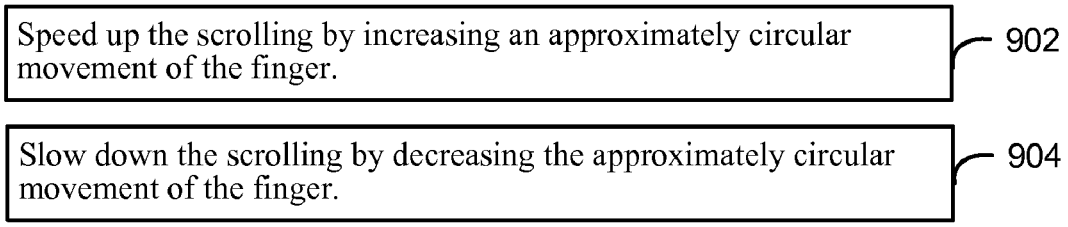
FIG. 9-10 are methods for interacting with a control via touchless sensing in accordance with an embodiment of the inventive arrangements.

Upon playing the message, the user may be presented with one or more controls for adjusting a scrolling rate of a control, changing the speed of delivery of the message, or indexing (fast-forward or rewinding) into the message. Embodiments of the invention are also directed to a touchless user interface suitable for use with an earpiece. The touchless user interface can include a touchless sensing unit having at least two sensory elements for determining a location of a finger within a proximity of the earpiece, tracking a movement of the finger in air within the proximity, and adjusting at least one earpiece control in accordance with the movement. The touchless user interface can include at least one touchpad for detecting a touching of the earpiece for selecting an earpiece control, detecting a release of the touching of the earpiece, and adjusting the earpiece control that is selected. The touchless user interface can include an audio module for audibly presenting an indicator for a control, wherein a control is a handle to an audio system. In one arrangement, a user can move a finger in air in an approximately circular motion to scroll through audio messages, wherein an indicator of an audio message can be audibly played during the approximately circular motion, and a content of the audio message can be audibly played upon a selection of the audio message. The audio module can speed up the playback of the email when an approximately circular and clockwise movement of the finger is detected, and slow down the playback of the email when an approximately circular and counter-clockwise movement of the finger is detected Referring to FIG. 9, a method 900 for tracking a finger movement is shown. The method 900 can be practiced with more or less than the number of steps shown. To describe the method 900, reference will be made to FIGS. 2 and 9 although it is understood that the method 900 can be implemented in any other suitable device or system using other suitable components. Moreover, the method 900 is not limited to the order in which the steps are listed in the method 900 In addition, the method 900 can contain a greater or a fewer number of steps than those shown in FIG. 9.

The method 900 can start in a state wherein one or more menu options are available to the user. For example, referring back to FIG. 7, a list of menu options such as voice mail, email, contacts, and calendar are available to the user through touchless sensing. The menu list may include more or less than the number of options shown. If the menu list is very long, it may be necessary to use relative location versus absolute location. Notably, absolute spacing on a very long menu list would result in low spatial finger resolution. That is, very small movement in the finger could be inadvertently associated with menu options. For example, if the menu list is 10 items long, and the entire circumference of the circular movement 121 is mapped equally to 10 items, each selection corresponds to an arc length of 2*pi*radius/10. In contrast, a relative location allows the user to space out the selection over greater circular arc lengths. For example, two revolutions of the circular movement 121 can be used for menu selection. In this case, each arc length corresponds to (2*pi*radius/10)* (2). Other schemes, such as spiral finger movements can be employed to increase the spatial finger resolution.

At step 902, an increase in the approximately circular movement of the finger can speed up the scrolling. For example, as the user moves the finger faster in an approximately circular pattern, the audible presentation of menu options can increase. For example, the user may want to quickly scroll ahead to a menu option. By increasing the speed of the finger, the scrolling can be increased. In practice, the touchless sensing unit 202 (See FIG. 2), can estimate a velocity of the finger over the circumference of the approximately circularly movement, and increase an audible presentation of the menu items as a function of the velocity. Velocity is distance over time. The touchless sensing unit 202 can measure the arc length and the time to calculate the velocity.

Similarly at step 904, a decrease in the approximately circular movement of the finger can slow down the scrolling. For example, as the user moves the finger slower in an approximately circular pattern, the audible presentation of menu options can decrease. For example, a user may want to rapidly skip ahead to a menu option but slow down as the menu option approaches. Accordingly, as the user moves the finger faster, the scrolling increases. When the user gets closer to the menu option, he or she can slow down the finger movement to decrease the menu selection resolution.

Figure 10:
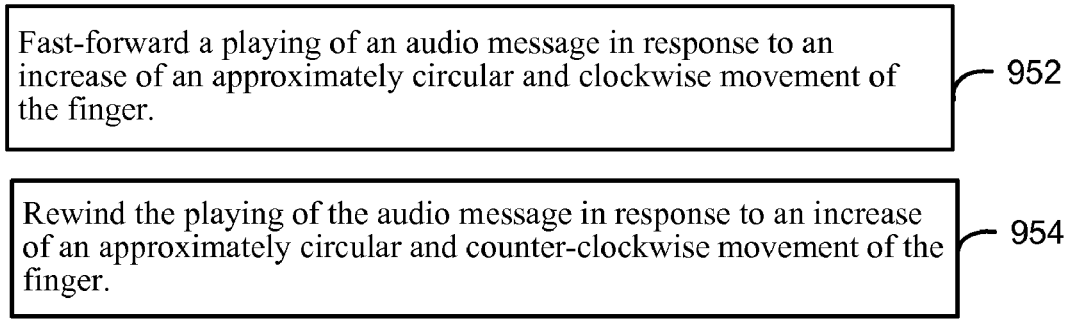

Referring to FIG. 10, a method 950 for adjusting a presentation of audio based on touchless finger movement is provided. The method 950 can be practiced with more or less than the number of steps shown. To describe the method 800, reference will be made to FIGS. 2 and 7 although it is understood that the method 950 can be implemented in any other suitable device or system using other suitable components. Moreover, the method 950 is not limited to the order in which the steps are listed in the method 950 In addition, the method 950 can contain a greater or a fewer number of steps than those shown in FIG. 10.

The method 950 can start in a state wherein a user has selected a form of audio media to play. For example, a user may perform touchless sensing to select a song to play from the earpiece, or an email message to play from the earpiece. As another example, referring to FIG. 7, the user may select an email message to play as the audio media. Upon playing the audio media, a speed control can be presented to the user to allow the user to adjust the speed of the audio media.

At step 952, a playing of an audio message can be fast forwarded in response to an increase of an approximately circular and clockwise movement of the finger. For example, referring to FIG. 2, the touchless sensing unit 202 can estimate an acceleration of the finger movement and fast forward the message as a function of the acceleration.

At step 954, the playing of the audio message can be rewound in response to an increase of an approximately circular and counter-clockwise movement of the finger. For example, referring to FIG. 2, the touchless sensing unit 202 can estimate a deceleration of the finger movement and rewind forward the message as a function of the deceleration.

Moreover, the method of 900 can be combined with method 950 to slow down or speed up a playing of a message. For example, a user can increase the rate of audio delivery to shorten the message length thereby decreasing the amount of play time. An example, may be where a user wants to scan through a voice mail message from a slow talker and listening for key words. Similarly, the user can decrease the rate of audio delivery to lengthen the message thereby increasing the amount of play time. An example, may be where a user wants to slow down a message from a fast talker to hear the details of the message more clearly.

Figure 11:
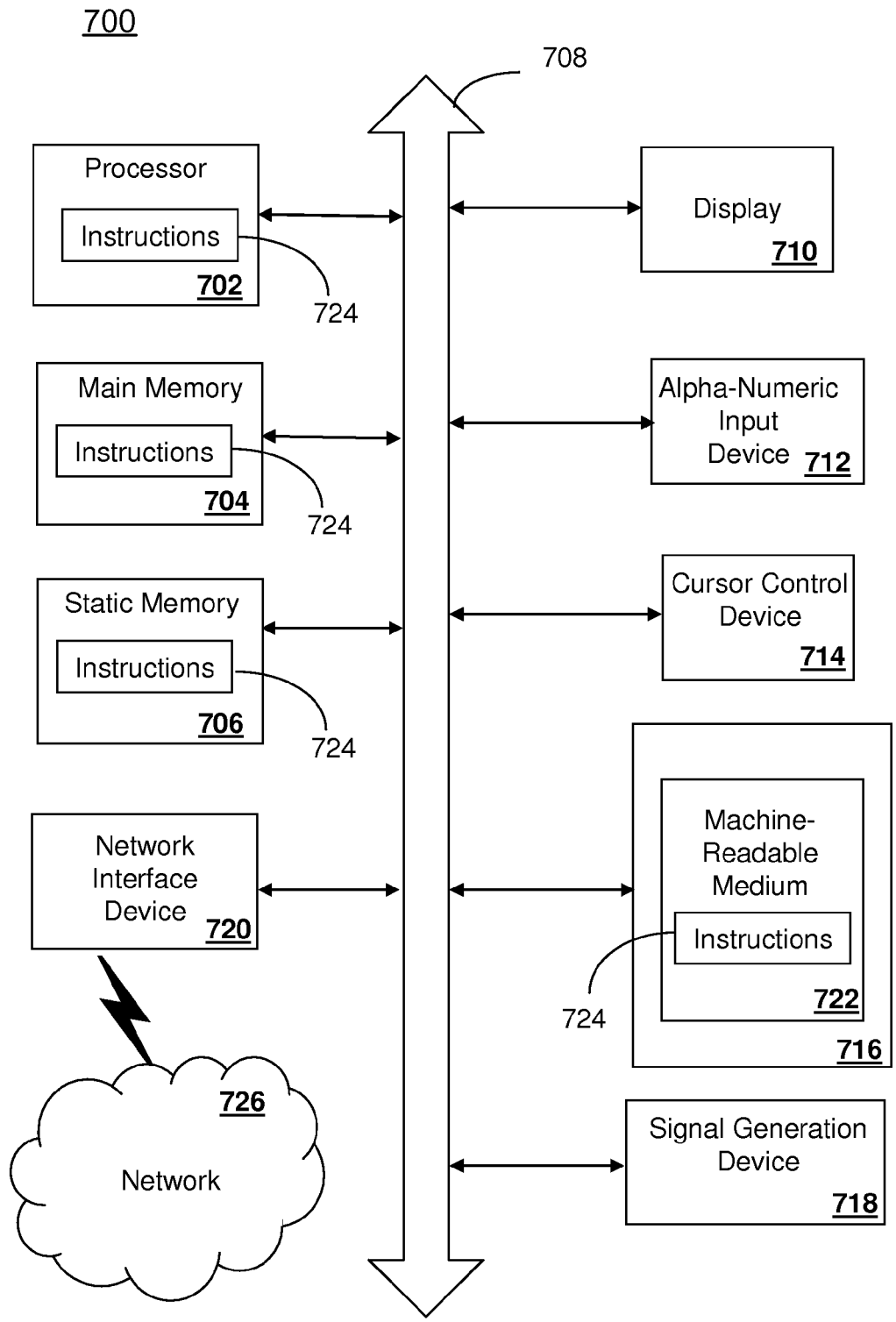
FIG. 11 is a diagrammatic representation of a machine in the form of a computer system within which a set of instructions, when executed, may cause the machine to perform any one or more of the methodologies discussed herein.

FIG. 11 depicts an exemplary diagrammatic representation of a machine in the form of a computer system 700 within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. It will be understood that a device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methodologies discussed herein.

The computer system 700 may include a processor 702 (e.g., a central processing unit (CPU), a graphics processing unit (GPU, or both), a main memory 704 and a static memory 706, which communicate with each other via a bus 708. The computer system 700 may further include a video display unit 710 (e.g., a liquid crystal display (LCD), a flat panel, a solid state display, or a cathode ray tube (CRT)). The computer system 700 may include an input device 712 (e.g., a keyboard), a cursor control device 714 (e.g., a mouse), a mass storage medium 716, a signal generation device 718 (e.g., a speaker or remote control) and a network interface device 720.

The mass storage medium 716 may include a computer-readable storage medium 722 on which is stored one or more sets of instructions (e.g., software 724) embodying any one or more of the methodologies or functions described herein, including those methods illustrated above. The computer-readable storage medium 722 can be an electromechanical medium such as a common disk drive, or a mass storage medium with no moving parts such as Flash or like non-volatile memories. The instructions 724 may also reside, completely or at least partially, within the main memory 704, the static memory 706, and/or within the processor 702 during execution thereof by the computer system 700. The main memory 704 and the processor 702 also may constitute computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions 724, or that which receives and executes instructions 724 from a propagated signal so that a device connected to a network environment 726 can send or receive voice, video or data, and to communicate over the network 726 using the instructions 724. The instructions 724 may further be transmitted or received over a network 726 via the network interface device 720.

While the computer-readable storage medium 722 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure.

The term "computer-readable storage medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and carrier wave signals such as a signal embodying computer instructions in a transmission medium; and/or a digital file attachment to e-mail or other self-contained information archive or set of archives is considered a distribution medium equivalent to a tangible storage medium. Accordingly, the disclosure is considered to include any one or more of a computer-readable storage medium or a distribution medium, as listed herein and including art-recognized equivalents and successor media, in which the software implementations herein are stored.

While the preferred embodiments of the invention have been illustrated and described, it will be clear that the embodiments of the invention is not so limited. Numerous modifications, changes, variations, substitutions and equivalents will occur to those skilled in the art without departing from the spirit and scope of the present embodiments of the invention as defined by the appended claims.

Where applicable, the present embodiments of the invention can be realized in hardware, software or a combination of hardware and software. Any kind of computer system or other apparatus adapted for carrying out the methods described herein are suitable. A typical combination of hardware and software can be a mobile communications device with a computer program that, when being loaded and executed, can control the mobile communications device such that it carries out the methods described herein. Portions of the present method and system may also be embedded in a computer program product, which comprises all the features enabling the implementation of the methods described herein and which when loaded in a computer system, is able to carry out these methods.

While the preferred embodiments of the invention have been illustrated and described, it will be clear that the embodiments of the invention is not so limited. Numerous modifications, changes, variations, substitutions and equivalents will occur to those skilled in the art without departing from the spirit and scope of the present embodiments of the invention as defined by the appended claims.

What is claimed is:

1. A method for operating a earpiece device, comprising:
    converting a vibration energy associated with a touching of the earpiece into an electric signal by way of piezoelectric transduction;
    from the electric signal, adjusting an energy and range of a projected touchless sensing field in air above a surface of the earpiece;
    in the touchless sensing field, detecting a pause of a finger at an approximately center location by way of a timer and threshold;
    based to the center location, adjusting a strength and range of the touchless sensing field upon detection of the pause;
    responsive to the adjusting, initiating three-dimensional (3D) touchless sensing to acquire control of the earpiece via touchless finger movements;
    determining a presence of finger within the touchless sensing field of the device;
    tracking a touchless movement of the finger in air within the touchless sensing field;
    adjusting a touchless control in accordance with the touchless movement.

2. The method of claim 1, further comprising:
    emitting a plurality of ultrasonic pulses from a first ultrasonic transmitter on the earpiece configured to transmit the ultrasonic pulses;
    digitally sampling and storing a history of received ultrasonic waveforms in a memory of the earpiece;

estimating from the stored ultrasonic waveforms a time of flight between transmitting and receiving of the ultrasonic pulses;

identifying an intersection point of three complex surfaces generated from the time of flight measurements for a plurality of microphones to produce a coarse location of the finger;

calculating for the plurality of ultrasonic waveforms stored in the memory a phase differential between the ultrasonic waveforms and previously received reflected ultrasonic waveforms, updating the coarse location of the finger from a mathematical weighting of said time of flight with said phase differential; and audibly presenting a touchless control when a touchless movement or the location of the finger corresponds to a touchless control.

3. The method of claim 1, further comprising:
selecting the touchless control and adjusting its sensitivity in accordance with a movement and closeness of the finger,
wherein an up and down movement of the finger enters a selection of the touchless control.

4. The method of claim 1, wherein the tracking a movement includes:
identifying an approximately circular motion of the finger; and
adjusting a touchless control and adjusting its sensitivity in accordance with the approximately circular motion and closeness of the finger to the earpiece,
wherein a clockwise motion relative to the finger increases the touchless control at a slower rate when closer than away, and a counter-clockwise motion relative to the finger decreases the touchless control at a slower rate when closer than away.

5. The method of claim 4, further comprising:
scrolling through a list in accordance with the approximately circular motion;
slowing a rate of the scrolling when the finger is close to provide precise control;
speeding a rate of the scrolling when the finger is away to provide coarse control;
audibly presenting at least one entry in the list during the approximately circular motion when the finger is close;
identifying a movement of the finger during the approximately circular motion; and
associating the at least one entry identified during the movement with a touchless control,
wherein the movement is at least one of a pause, an up and down motion, or a forward projecting motion.

6. The method of claim 5, wherein identifying a movement includes:
identifying a forward projecting motion of the finger in the three dimensional sensing field for selecting the at least one entry, identifying an up and down motion of the finger for selecting the at least one entry, or identifying a pause of the finger for selecting the at least one entry.

7. The method of claim 5, wherein the audibly presenting is based on at least one of an absolute location of the finger, a relative location of the finger, or a pause at a location of the finger.

8. The method of claim 5, wherein an entry includes at least one of a song selection, a track selection, a volume selection, a balance selection, an equalization selection, a contact selection, a call selection, an email selection, a voicemail selection, or an audio message.

9. The method of claim 5, wherein a control is a handle to an email account, such that a user moves a finger in air in an approximately circular motion and scrolls through email, a field of an email is audibly played during the approximately circular motion, and a portion of content of the email is audibly played upon a selection of the email.

10. The method of claim 5, further comprising:
speeding up the scrolling by increasing an approximately circular movement of the finger; and
slowing down the scrolling by decreasing the approximately circular movement of the finger.

11. The method of claim 1, further comprising:
fast-forwarding a playing of an audio message in response to an increase of an approximately circular and clockwise movement of the finger; and
rewinding the playing of the audio message in response to an increase of an approximately circular and counter-clockwise movement of the finger.

12. The method of claim 1, further comprising:
detecting a touching of the device for activating at least one touchless control; and
adjusting the at least one control in accordance with the movement of the finger in the air.

13. An earpiece comprising:
a touchless sensing unit having at least two sensory elements for
converting a vibration energy associated with a tapping of the earpiece into an electric signal by way of piezoelectric transduction;
creating a low-energy short-range touchless sensing field in air above a surface of the earpiece from the electric signal;
detecting a pause of a finger at an approximately center location by way of a timer and threshold in the touchless sensing field;
adjusting a strength and range of the touchless sensing field upon detection of the pause according to the center location;
initiating three-dimensional (3D) touchless sensing to acquire control of the earpiece via touchless finger movements responsive to the adjusting;
determining a location of a finger within the touchless sensing field of the earpiece,
tracking a movement of the finger in air within the touchless sensing field,
adjusting at least one earpiece control in accordance with the movement.

14. The earpiece of claim 13, wherein the touchless sensing unit
identifies a closeness of the finger to the earpiece and an approximately circular motion of the finger; and
adjusts a control in accordance with the approximately circular motion and the closeness,
wherein a clockwise motion relative to the finger increases the control at a slower rate when closer than away, and a counter-clockwise motion relative to the finger decreases the control at a slower rate when closer than away.

15. The earpiece of claim 13, further comprising an audio module for audibly presenting a control, wherein a user scrolls through a list in accordance with the approximately circular motion, the audio module presents at least one entry in the list during the approximately circular motion, and the touchless sensing unit identifies a movement of the finger during the approximately circular motion, and associates the movement with the at least one entry of the control.

16. The earpiece of claim 15, wherein the touchless sensing unit identifies a forward projecting motion of the finger for selecting the at least one entry, identifies an up and down motion of the finger for selecting the at least one entry, or identifies a pause of the finger for selecting the at least one entry.

17. The earpiece of claim 13, wherein the earpiece is at least one of an ear bud, a Bluetooth earpiece, a Bluetooth headset, a behind the ear device, an in-the-canal earpiece, a hearing aid, a ZigBee earpiece, a ZigBee headset, or an in-the-ear cell phone.

18. The earpiece of claim 13, wherein the sensors are ultrasonic sensors or light emitting elements.

19. A touchless earpiece suitable for use with an earpiece, comprising:
   a touchless sensing unit having at least two sensory elements for
      converting a vibration energy associated with a tapping of the earpiece into an electric signal by way of piezoelectric transduction;
      creating a low-energy short-range touchless sensing field in air above a surface of the earpiece from the electric signal;
      detecting a pause of a finger at an approximately center location by way of a timer and threshold in the touchless sensing field;
      adjusting a strength and range of the touchless sensing field upon detection of the pause according to the center location;
      initiating three-dimensional (3D) touchless sensing to acquire control of the earpiece responsive to the adjusting;
      determining a relative location and closeness of a finger around the center location of the touchless sensing field of the earpiece,
      tracking a movement of the finger in air within the touchless sensing field,
      adjusting at least one control in accordance with the location and movement, and
   an audio module for audibly presenting at least one entry of the control,
wherein the touchless sensing unit allows a user to navigate through a menu list that is audibly played when the location of the finger or the movement of the finger corresponds to an entry.

20. The method of claim 19, wherein the audio module speeds up the menu list when an approximately circular and clockwise movement of the finger is detected as a sensitivity of distance, and slows down the playback of the email when an approximately circular and counter-clockwise movement of the finger is detected as a sensitivity of closensess.

* * * * *